United States Patent [19]

Yoshida

[11] Patent Number: 5,365,530
[45] Date of Patent: Nov. 15, 1994

[54] ERROR-CORRECTION ENCODING AND DECODING SYSTEM

[75] Inventor: Hideo Yoshida, Kanagawa, Japan

[73] Assignee: Mitsubishi Denki Kabushiki Kaisha, Tokyo, Japan

[21] Appl. No.: 881,533

[22] Filed: May 12, 1992

[51] Int. Cl.$^5$ .................... H03M 13/00; G11B 20/18
[52] U.S. Cl. ................................... 371/37.4
[58] Field of Search ...................... 371/37.4

[56] References Cited

PUBLICATIONS

Kasahara, M. et al., "New Classes of Binary Codes Constructed on the Basis of Concaterated Codes and Product Codes", *IEEE Trans. on Information Theory*, vol. IT-22, No. 4, Jul. 1976, pp. 462–468.

1990 International Symposium ... "The Superimposed Codes and its Application to Digital VCR" Inoue, Yoshida & Ishida.

IEEE Transactions on Consumer Electronics, vol. 37, No. 3, 8–91 "An Experimental Home-Use Digital VCR W/3-Dimensional DCT ... ".

*Primary Examiner*—Stephen M. Baker
*Attorney, Agent, or Firm*—Wolf, Greenfield & Sacks

[57] ABSTRACT

The present invention provides an error-correction code encoding and decoding technique in which an information amount is variable in a block, and error-correction encoding in the block can be done efficiently without a substantial change in circuit configuration regardless of information amount. An encoder comprises a C1 encoding section for encoding an Ip information series, a C3 encoding section for encoding an Is information series, a control circuit for controlling the encoding sections based on an identification signal indicating whether the Is information series is contained, and a buffer memory. If an Is information series is contained, an area corresponding to the Is information series is deleted from check symbols of the Ip information series and replaced with coded data of the Is information series. A decoder decodes a received word thus encoded. This obviates superimposition-separation of C3 information, thereby realizing efficient error-correction encoding in a block, while maintaining an information amount of a block variable, without any change in circuit configuration based on information amount.

17 Claims, 7 Drawing Sheets

ERROR-CORRECTION ENCODING AND DECODING SYSTEM

BACKGROUND OF THE INVENTION

1. Field of the Invention

The present invention relates to an error-correction encoding and decoding system in which an information size in a block is variable and efficient error-correction encoding and decoding in a block can be attained.

2. Description of the Related Art

FIG. 1 shows an example of a code structure employed for a conventional error-correction encoder, encoding method, decoder and decoding method, as described in the article entitled "A Note on Error Correcting Code Structure for Home Use Digital VTR Using Superimposed Codes" carried in pages 27 to 32 in "Technological Research Report of the Association of Electronic Information Communication", Vol. 90, No. 28. IT 90-12 (issued on May 16, 1990).

In FIG. 1, the reference numeral 1 denotes a data block of $(n_1 \times n_2)$ which is $n_1$ digits long in the first direction and $n_2$ digits long in the second direction; and 2 an Ip information series of $(k_1 \times k_2)$ encoded in data block 1, which is $k_1$ digits long in the first direction and $k_2$ digits long in the second direction; 3 C2 check symbols each having a length of $(n_2-k_2)$ digits, which are added to Ip information series 2 when Ip information series 2 is C2-linear-encoded to a code length $n_2$ in the second direction; 4 C1 check symbols each having a length of $(n_1-k_1)$ digits, which are added to Ip information series 2 and C2 check symbols 3 when Ip information series 2 and C2 check symbols 3 are C1-linear-encoded to a code length $n_1$ in the first direction; 5 an Is information series which has a digit number r in the first direction smaller than the digit number $(n_1-k_1)$ of C1 check symbols and has a digit number $k_3$ in the second direction smaller than the number of stages $n_2$ of data block 1; 6 C3 check symbols each having a length of $(n_2-k_3)$ digits, which are added to Is information series 5 when Is information series 5 is C3-linear-encoded to a code length $n_2$ in the second direction.

Next, the operation of the prior art system will be described. Ip information series 2 of $(k_1 \times k_2)$ digits is a product code obtained by C2-linear-encoding an information word of $k_1$ digits to have an information length of $k_2$ digits, a check symbol length of $(n_2-k_2)$ digits and a code length of $n_2$ digits in the second direction and further C1-linear-encoding an information word of $k_2$ digits to have an information length of $k_1$ digits, a check symbol length of $(n_1-k_1)$ digits and a code length of $n_1$ digits in the first direction.

On the other hand, in Is information series 5 of a size of $(r \times k_3)$ digits having r digits smaller than $(n_1-k_1)$ digits in the first direction and $k_3$ digits smaller than $n_2$ digits in the second direction, code words each having a length of r digits are C3-linear-encoded to have an information length of $k_3$ digits, a check symbol length of $(n_2-k_3)$ digits and a code length of $n_2$ digits in the second direction.

The data C3-linear-encoded is added to (superimposed on) a part of C1 check symbols C1-linear-encoded, which is shown as a hatched area in FIG. 1, on the finite body. Thus, data block 1 of $(n_1 \times n_2)$ digits is formed to contain Ip information series 2 and Is information series 5.

Next, a decoding operation will be described. A received data block having a size of $(n_1 \times n_2)$ digits containing the superimposing data is C1-decoded. Then, C3 codes superimposing on the hatched portion of C1 check symbols 4 are separated. In this superimposition-separation, an elimination flag is set in the hatched portion of the check symbols 4 and elimination is corrected during C1 decoding.

The size of an obtained elimination error at the eliminated position is superimposition-separated as C3 code data, and, at the same time, digit error correction is executed through error correction on data which have not superimposed on. If elimination cannot be corrected during C1 decoding, a flag is set indicating that correction is impossible.

Ip information series 2 of $(k_1 \times k_2)$ digits is decoded by executing elimination-correction in C2 decoding using the correction-impossible flag of C1 decoding. The received C3 code words of the Is information series of $(r \times k_3)$ digits is decoded by executing elimination-correction in C3 decoding using the correction-impossible flag of C1 decoding.

Consequently, if an information size is within the size of Ip information series 2, product codes of $(n_1 \times n_2)$ digits are formed to include C1 codes and C2 codes. If an information size is larger than the size of the Ip information series, C3 codes are formed as Is information series 5 to superimpose on the product codes, thereby increasing an information amount. The code structure of FIG. 1 is therefor effective for error correction.

Since conventional encoder, encoding method, decoder and decoding method are such as described above, when Is information series 5 is added, encoding requires an arithmetic operation to superimpose C3 codes and decoding requires an arithmetic operation to superimposition-separate C3 codes. However, the amount of operations is large. In decoding C3 codes, since C3 codes are superimposition-separated from C1 codes, an increase in number of error digits of C1 codes makes the superimposition-separation and the decoding of C3 codes impossible. Furthermore, C3 decoding can be initiated only after the superimposition-separation executed in decoding C1 codes, resulting in much time to decode an entire block.

SUMMARY OF THE INVENTION

The present invention has been proposed to solve the aforesaid problems. An object of the present invention is to provide error-correction encoding and decoding which obviate the superimposition of C3 information despite a large amount of information, are achievable with hardware of almost the same scale as conventional encoder arid decoder for information-variable error-correction codes of a data block and permit parallel decoding operations to provide Ip information and Is information series.

An error-correction code encoder according to the present invention comprises a first encoding section for encoding an Ip information series to coded data including check symbols each having a length of $(n_1-k_1)$ digits in the first direction; a second encoding section for encoding an Is information series to coded data including check symbols each having a length of $(n_2-k_3)$ digits in the second direction; a buffer memory for storing the coded data and the check symbols; and an encoding control circuit for controlling the first and the second encoding sections and the buffer memory by deciding whether only the Ip information series or both the Ip information series and the Is information series are input to the buffer memory.

In performing the encoding using the above encoder. r-digit check symbols to be deleted during transmission are not stored in the buffer memory when Ip information series and Is information series are encoded in the first direction.

A decoder for decoding data sent from the above encoder comprises a buffer memory for storing a received word of $(n_1 \times n_2)$ digits sent from the encoder; a first decoding section for decoding an Ip information series; a second decoding section for decoding an Is information series; and a decoding control circuit for controlling the buffer memory and the first and second decoding sections by deciding whether the received word stored in the buffer memory contains only the Ip information series or both the Ip information series and Is information series.

In performing the decoding using the above decoder, when a received word contains an Ip information series and an Is information series, r-digit check symbols deleted in transmission are considered as eliminated digits and the eliminated digit portion is not corrected at the time of the decoding in the first direction.

When an identification signal indicates that only an Ip information series has been stored, the encoding control circuit according to the present invention causes coded data encoded by the first encoding section to be output from the buffer memory. When an identification signal indicates that both the Ip information series and the Is information series are contained, the encoding control circuit causes the first encoding section to encode the Ip information series and the second encoding section to encode the Is information series, causes $(r \times n_2)$ digits in the check symbols contained in the coded data encoded by the first encoding section to be deleted so as not to be output from the buffer memory and causes data of $(r \times n_2)$ digits encoded by the second encoding section to be output.

In an error-correction code encoding method according to the present invention, when the above encoder is used to encode an Ip information series and an Is information series in the first direction by a first encoding section, r-digit check symbols to be deleted during transmission are not stored in the buffer memory, resulting in a reduced encoding period of time.

When an identification signal indicates that a received word includes only an encoded Ip information series, the decoding control circuit according to the present invention causes only the first decoding section to operate. When an identification signal indicates that a received word includes an Ip information series and an Is information series, the decoding control circuit causes the first decoding section to decode the Ip information series and the second decoding section to decode the Is information series.

In the decoding method according to the present invention, when a received work includes both an Ip information series and an Is information series, the first decoding section, in performing the decoding in the first direction, considers r digits deleted during transmission as elimination digits so as not to correct the elimination digits, resulting in a reduced decoding period of time.

DESCRIPTION OF THE PREFERRED EMBODIMENTS

Figure 1:
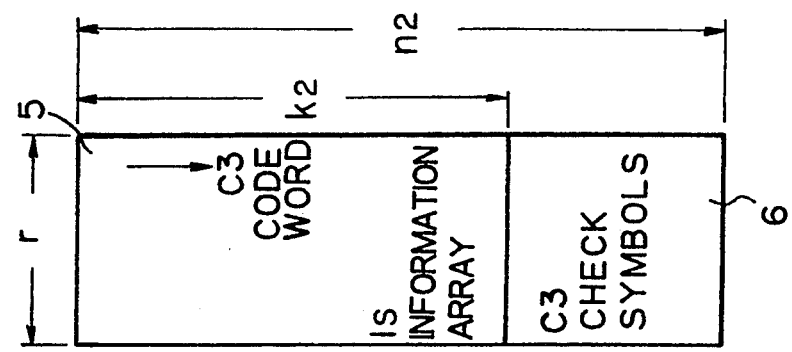
FIG. 1 shows an example of a code structure employed in a conventional error-correction code encoding and decoding system.
Figure 1:
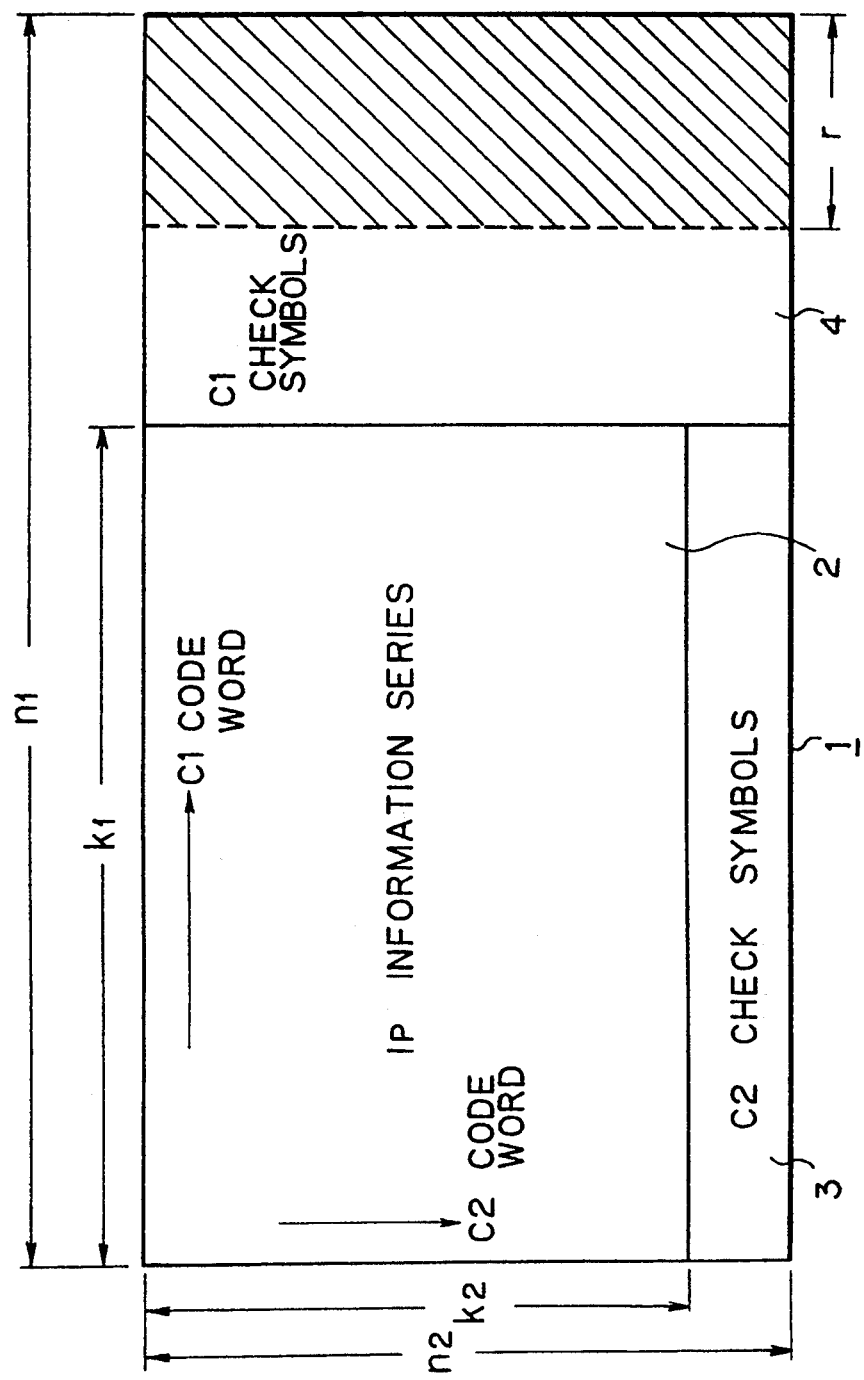
Figure 2:
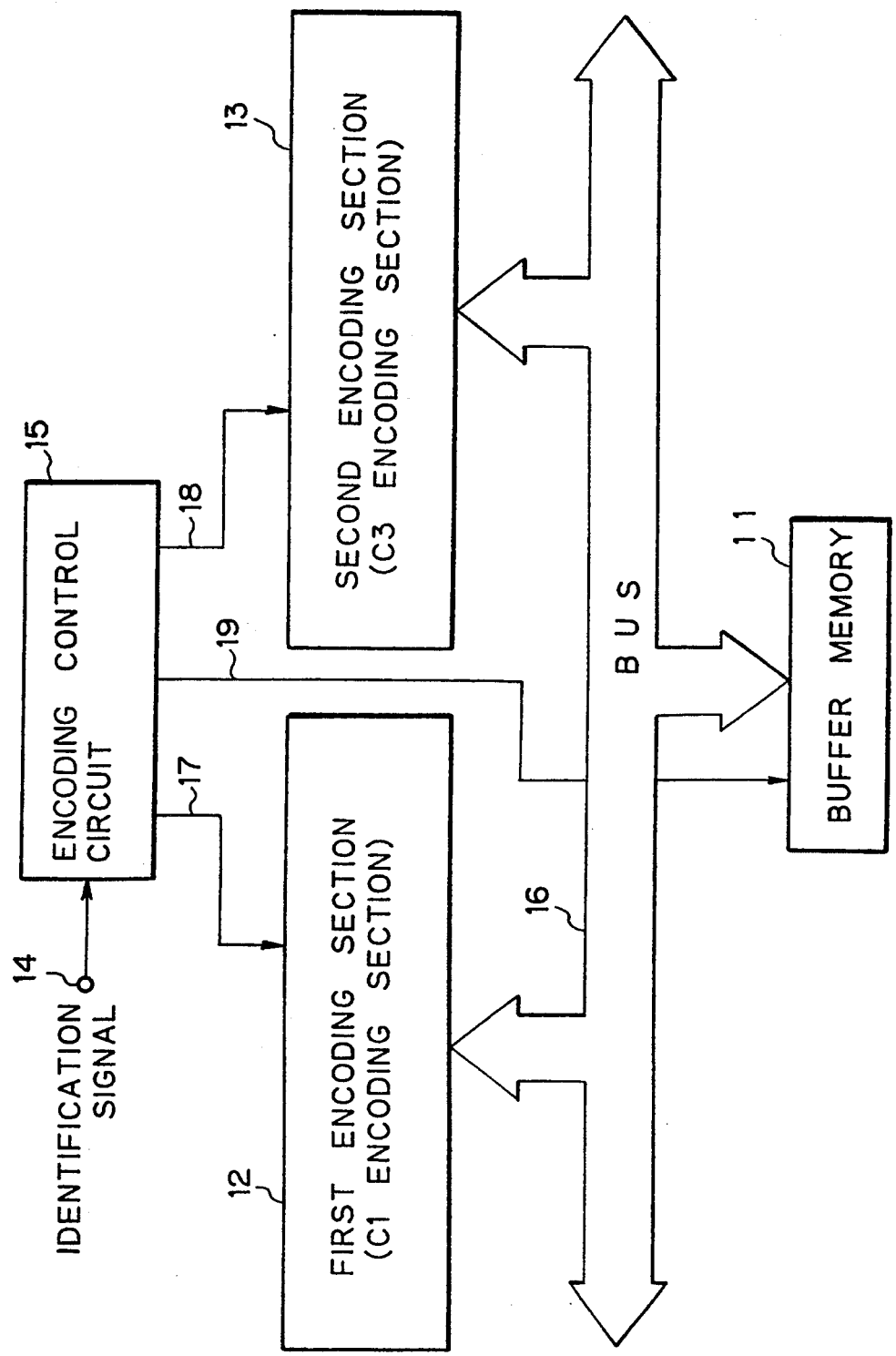
FIG. 2 is a block diagram showing the configuration of an embodiment of an encoder according to the present invention.
Figure 3:
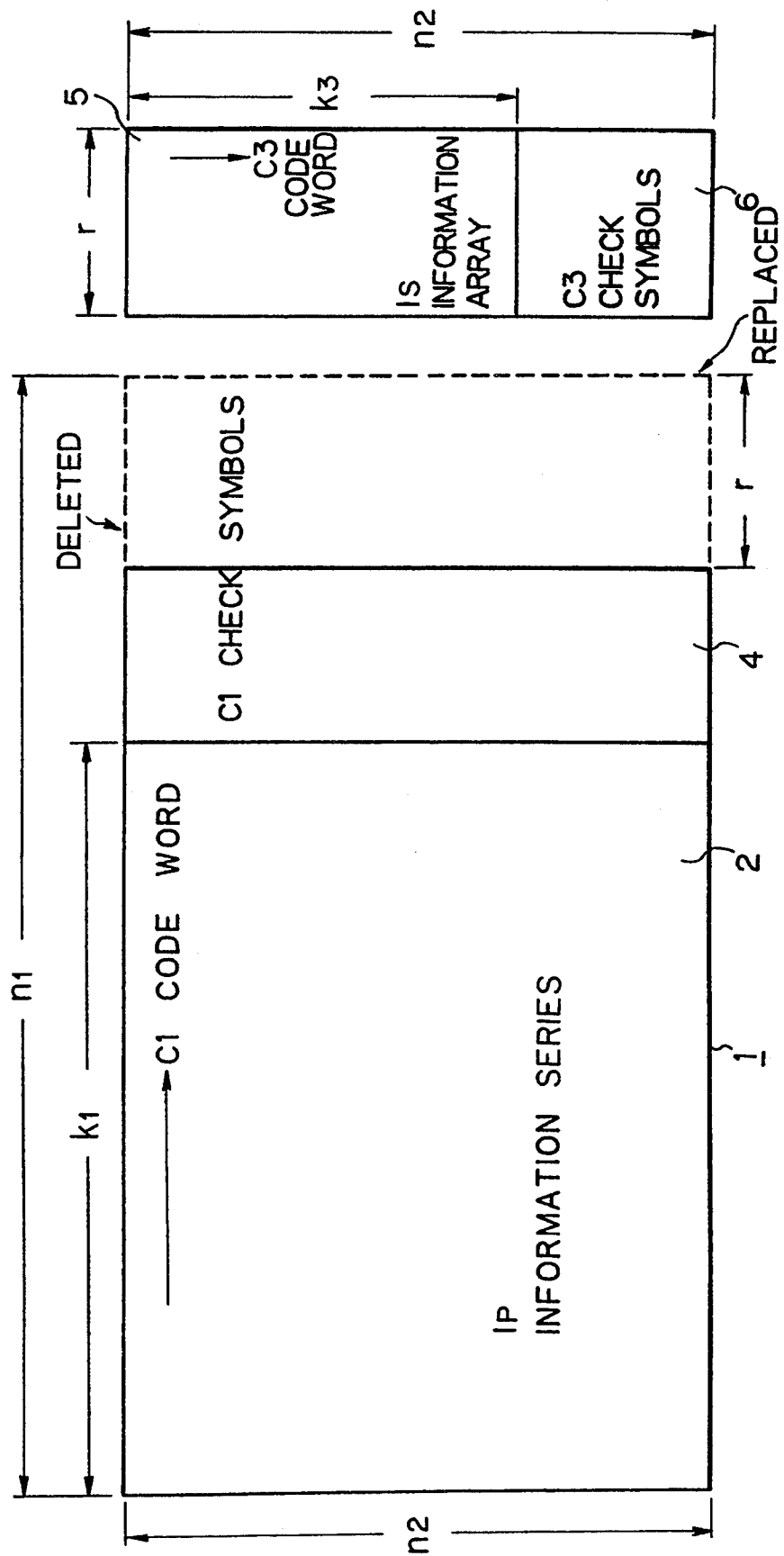
FIG. 3 shows an example of a code structure employed in the encoder of FIG. 2.

Embodiments of the present invention will be described in conjunction with the drawings. FIG. 2 is a block diagram showing the configuration of an embodiment of an encoder according to the invention. FIG. 3 shows an example of a code structure employed in the encoder, using the same numerals and symbols as in FIG. 1 to designate similar components, whereby the description thereof will be omitted here. In FIG. 3, Ip information series 2 is $k_1 \times n_2$ $(=k_2)$ digits.

In FIG. 2, the reference numeral 11 denotes a buffer memory for storing C1 check symbols 4 and C3 check symbols 6 generated by encoding Ip information series 2 and Is information series 5, respectively; 12 a C1 encoding section (a first encoding section) for C1-linear-encoding Ip information series 2; 13 a C3 encoding section (a second encoding section) for C3-linear-encoding Is information series; 14 an identification signal for indicating whether only Ip information series 2 or Ip information series 2 and Is information series 5 are input to buffer memory 11; 15 an encoding control circuit for controlling C1 encoding section 12, C3 encoding section 13, and buffer memory 11 according to identification signal 14; 16 an address/data/control signal bus (hereafter, called a bus) which transfers data between buffer memory 11, C1 encoding section 12, C3 encoding section 14 and external equipment; 17 a control signal for controlling C1 encoding section 12; 18 a control signal for controlling C3 encoding section 13; and 19 a control signal for controlling buffer memory 11.

Next, the operation will be described. Assuming that only Ip information series 2 is input to buffer memory 11 via bus 16, identification signal 14 indicates the fact. At this time, encoding control circuit 15 sends control signals 17, 18 and 19 based on identification signal 14 to control C1 encoding section 12, C3 encoding section 13 and buffer memory 11.

In response to control signal 17, C1 encoding section 12 encodes Ip information series 2 for each $k_1$-digit data (laterally in FIG. 3) $n_2$ times to provide C1 linear codes each having a code length of $n_1$ digits. Thus, Ip information series 2 is encoded to coded data of $(n_1 \times n_2)$ digits which is in turn stored in buffer memory 11.

Control signal 18 prevents C3 encoding section 13 from executing an encoding operation. Control signal 19 causes the coded data of $(n_1 \times n_2)$ digits to be output from buffer memory 11 to bus 16.

Next, assuming that both Ip information series 2 and Is information series 5 are input to buffer memory 11, identification signal 14 indicates the fact. At this time, encoding control circuit 15 sends control signals 17, 18 and 19 based on identification signal 14 to control C1 encoding section 12, C3 encoding section 13 and buffer memory 11.

In response to control signal 17, C1 encoding section 12 encodes Ip information series 2 for each $k_1$-digit data (laterally in FIG. 3) $n_2$ times to provide C1 linear codes each having a code length of $n_1$ digits. Thus, Ip information series 2 is encoded to coded data of $(n_1 \times n_2)$ digits which is in turn stored in buffer memory 11. At this time, an eliminated portion of C1 check symbols 4 having a size of $(r \times n_2)$ digits (encircled with a dashed line in FIG. 3 and corresponding to C3 codes) is deleted so that the portion will not be written in buffer memory 11.

In response to control signal 18, C3 encoding section 13 encodes Is information series 5 for each $k_3$-digit data (longitudinally in FIG. 3) r times to provide C3 linear codes each having a code length of $n_2$. Thus, Is information series 5 is encoded to data of $(r \times n_2)$ digits which is in turn stored in buffer memory 11.

With control signal 19, data block 1 of $(n_1 \times n_2)$ digits containing coded data of $\{(n_1-r) \times n_2\}$ based on Ip information series 2 and coded data of $(r \times n_2)$ digits based on Is information series 5 is output from buffer memory 11 to bus 16.

In the code structure of FIG. 3, Ip information series 2 is encoded only in the first direction to provide C1 linear codes. Similar to the prior art shown in FIG. 1, however, Ip information series 2 may be encoded in the second direction to provide C2 linear codes. In this case, a code structure resistive to a burst error can be obtained in data transmission in the first direction.

Figure 4:
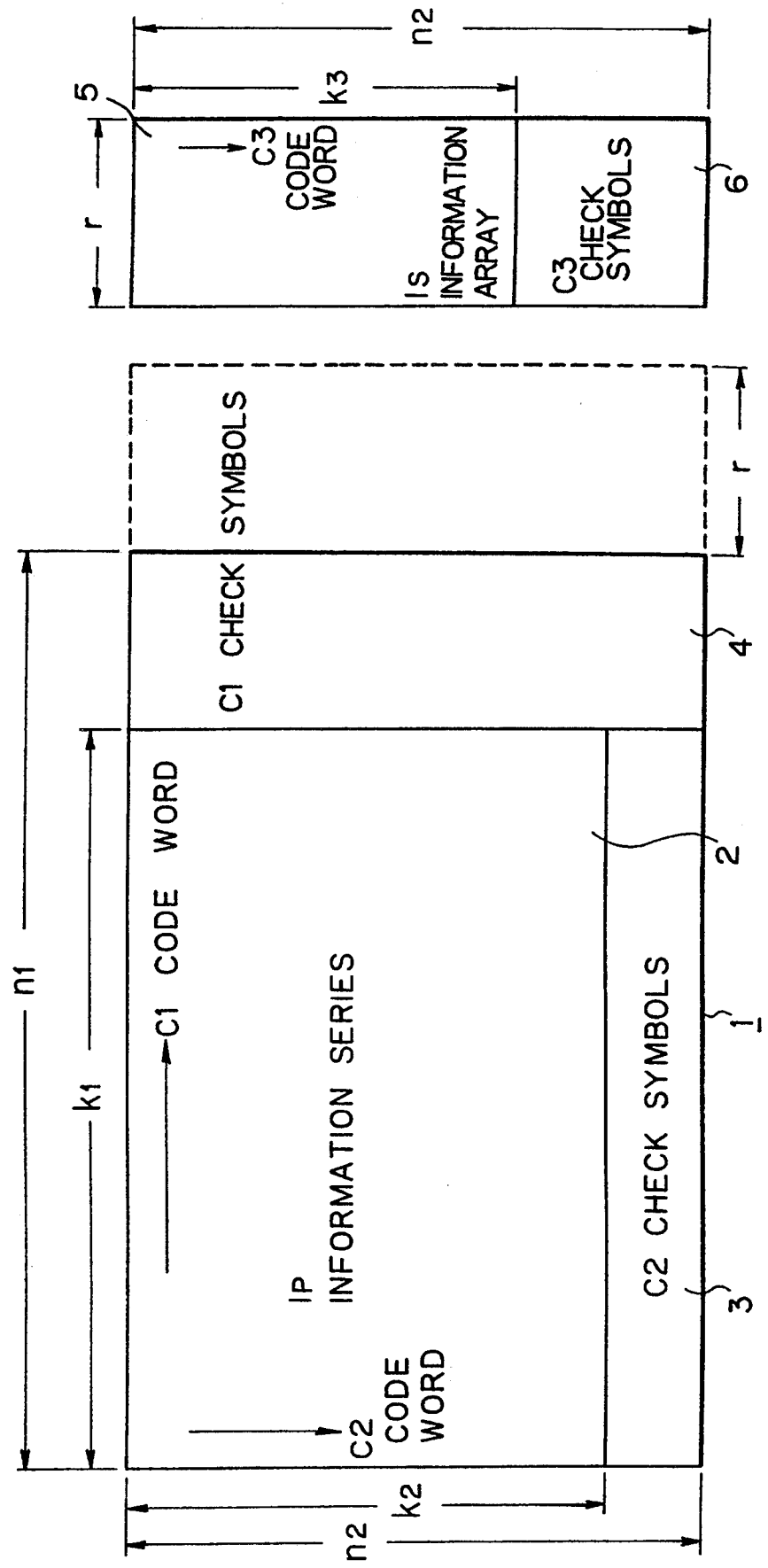
FIG. 4 shows an example of an other code structure used in the present invention.

FIG. 4 shows a code structure for encoding Ip information series 2 having a code length of $k_2$ digits in the second direction, the $k_2$ digits being encoded to $n_2$ digits.

In the code structure shown in FIG. 4, C1 encoding section 12 shown in FIG. 2 has a C2 encoding function for C2-linear-encoding Ip information series 2 in the second direction, as well as the C1 encoding function. In this case, since a burst error can be detected by the C1 codes, C2 codes have a burst error correction capability half of that the C3 codes have.

Figure 5:
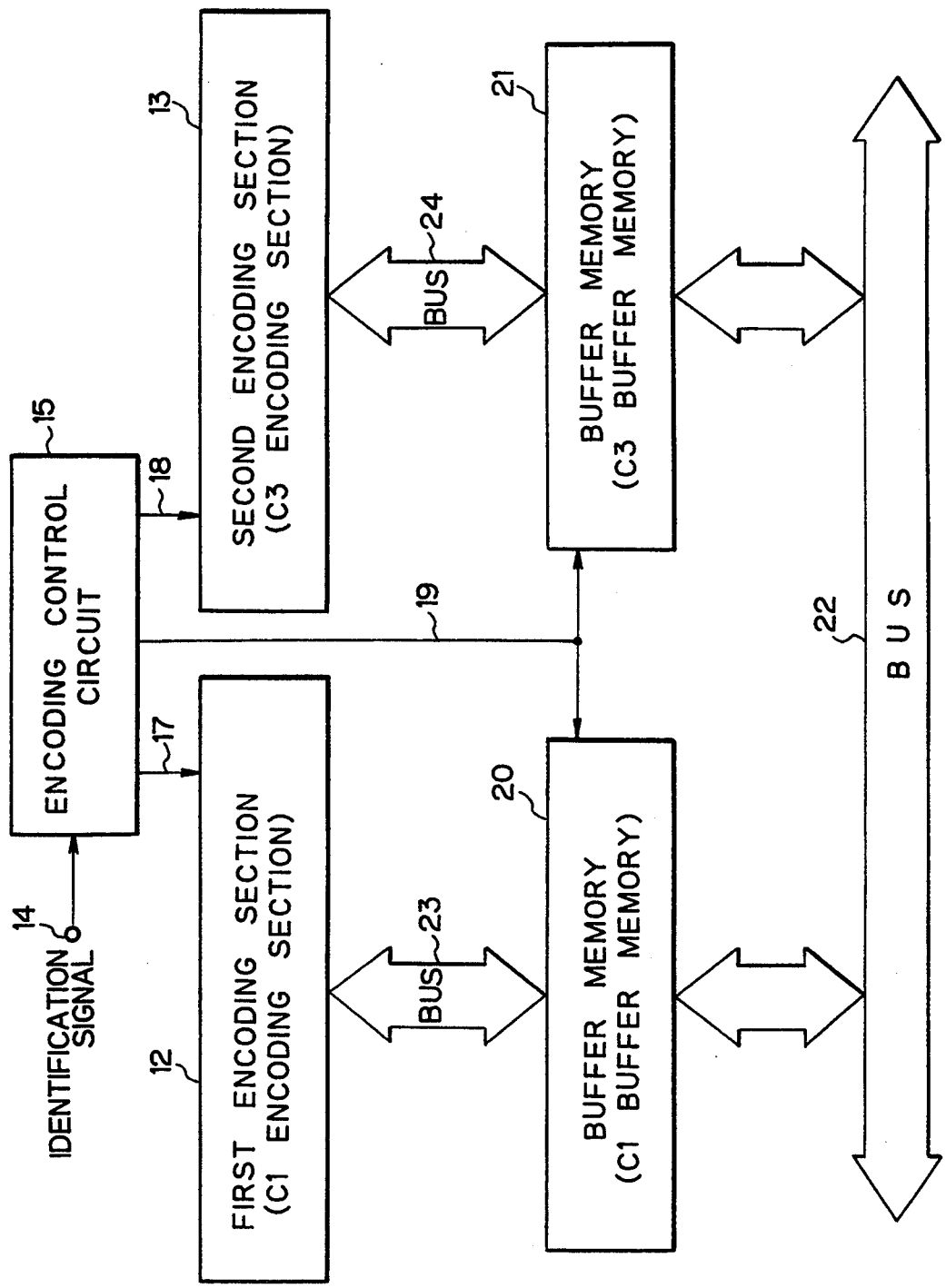
FIG. 5 is a block diagram showing the configuration of another embodiment of an encoder according to the present invention.

In the above embodiment, buffer memory 11 communicates with C1 encoding section 12 and C3 encoding section 13. A buffer memory may be provided, however, for each of C1 encoding section 12 and C3 encoding section 13, resulting in faster encoding. FIG. 5 is a block diagram showing the configuration of an encoder in which buffer memories are provided for C1 encoding section and C3 encoding section. Components identical to those in FIG. 2 are designated by the same numerals, and the description thereof will be omitted here.

In FIG. 5, the reference numeral 20 denotes a first buffer memory (a C1 buffer memory) to which C1 encoding section 12 gets access exclusively; 21 a second buffer memory (a C3 buffer memory) to which C3 encoding section 13 gets access exclusively; 22 a bus interconnecting buffer memories 20 and 21 and external equipment; 23 a bus interconnecting C1 buffer memory 20 and C1 encoding section 12; and 24 a bus interconnecting C3 buffer memory 21 and C3 encoding section.

Next, the operation will be described. Assuming that only Ip information series 2 is input to C1 buffer memory 20, identification signal 14 indicates the fact. At this time, encoding control circuit 15 sends control signals 17, 18 and 19 based on identification signal 14 to control C1 encoding section 12, C3 encoding section 13, C1 buffer memory 20 and C3 buffer memory 21.

In response to control signal 17, C1 encoding section 12 encodes Ip information series 2 for each $k_1$-digit data (laterally in FIG. 3) $n_2$ times to provide C1 linear codes each having a code length of $n_1$ digits. Thus, Ip information series 2 is encoded to coded data of $(n_1 \times n_2)$ digits which is in turn stored in C1 buffer memory 20.

Control signal 18 prevents C3 encoding section 13 from executing encoding operation. Control signal 19 causes the coded data of $(n_1 \times n_2)$ digits to be output from C1 buffer memory 20 to bus 22 and no data to be output from C3 buffer memory 21.

Next, assuming that Ip information series 2 is input to C1 buffer memory 20 and that Is information series 5 is input to C3 buffer memory 21, identification signal 14 indicates the fact. At this time, encoding control circuit 15 sends control signals 17, 18 and 19 based on identification signal 14 to control C1 encoding section 12, C3 encoding section 13, C1 buffer memory 20 and C3 buffer memory 21.

In this embodiment, in response to control signal 17, C1 encoding section 12 encodes Ip information series 2 for each $k_1$-digit data (laterally in FIG. 3) $n_2$ times to provide C1 codes of $n_1$ digits. Thus, Ip information series 2 is encoded to coded data of $(n_1 \times n_2)$ digits which is in turn stored in C1 buffer memory 20 via bus 23.

At the same time, in response to control signal 18, C3 encoding section 18, parallel with the C1 encoding section 12, encodes Is information series 5 for each $k_3$-digit data (laterally in FIG. 3) r times to provide C3 linear codes each having a code length of $n_3$ digits. Thus, Is information series 5 is encoded to data of $(r \times n_2)$ digits which is in turn stored in buffer memory 21.

Control signal 19 causes coded data of $\{(n_1-r) \times n_2\}$ digits which is based on Ip information series 2 to be taken out of C1 buffer memory 20, and coded data of $(r \times n_2)$ digits which is based on Is information series 5 to be taken out of C3 buffer memory 21. Thus, coded data having a total of $(n_1 \times n_2)$ digits is output to bus 22.

Figure 6:
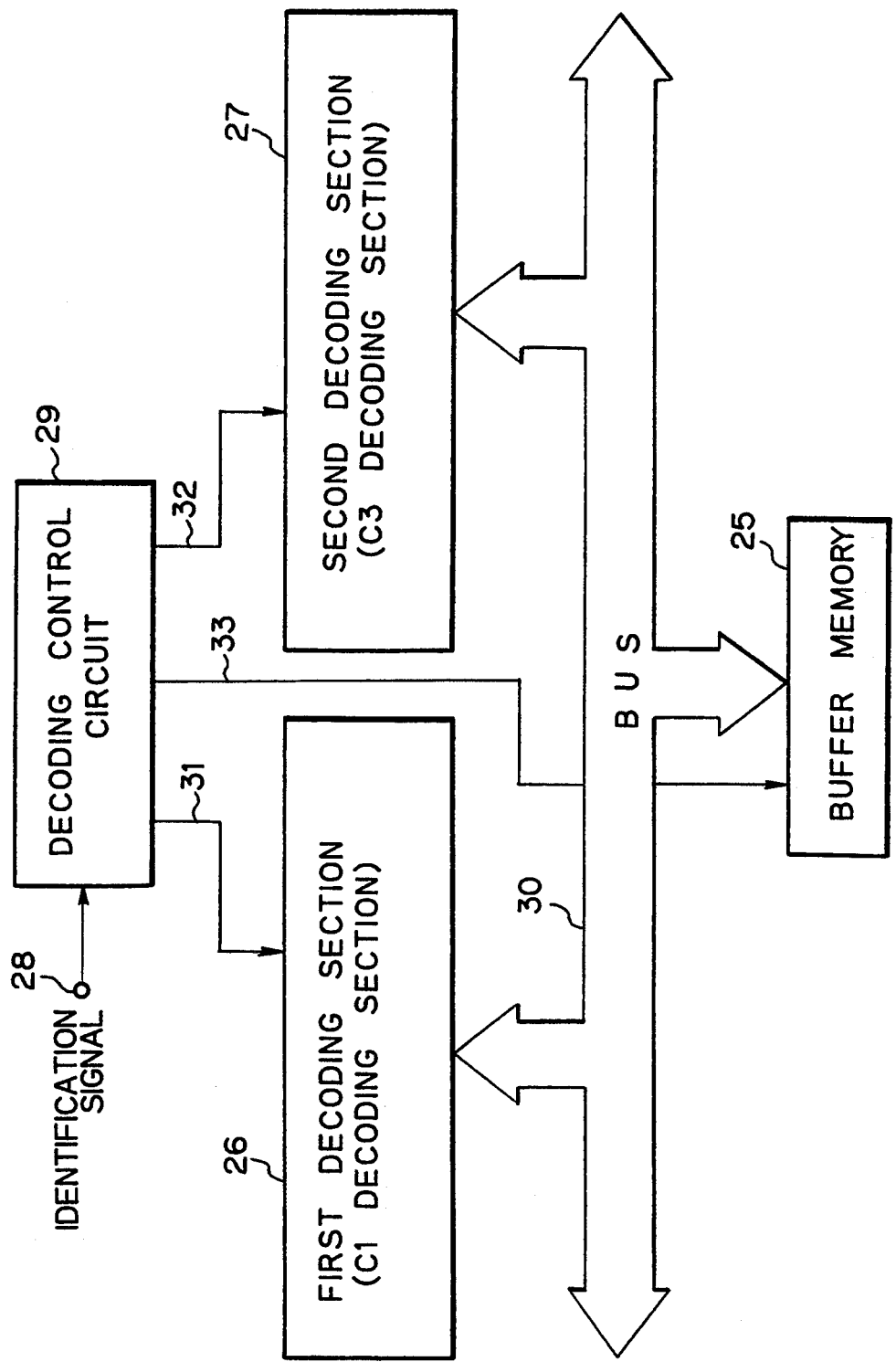
FIG. 6 is a block diagram showing the configuration of an embodiment of a decoder according to the present invention.

Next, a decoding operation of information encoded in a manner mentioned above will be described. FIG. 6 is a block diagram showing the configuration of an embodiment of a decoder according to the present invention.

In FIG. 6, the reference numeral 25 denotes a buffer memory for storing a received word containing encoded Ip information series 2 and encoded Is information series 5; 26 a C1 decoding section (a first decoding section) for decoding a received word of Ip information series 2; 27 a C3 decoding section (a second decoding section) for decoding a received word of Is information series 5; 28 an identification signal for indicating whether a received word input to buffer memory 25 includes only Ip information series 2 or both Ip information series 2 and Is information series 5; 29 a decoding control circuit for controlling C1 decoding section 26, C3 decoding section 27 and buffer memory 25; 30 an address/data/control signal bus (hereafter called a bus) for transferring data between buffer memory 25, C1 decoding section 12, C3 decoding section 13 and external equipment; 31 a control signal for controlling C1 decoding section 26; 32 a control signal for controlling C3 decoding section 27; and 33 a control signal for controlling buffer memory 25.

Next, the operation will be described in conjunction with FIGS. 3 and 6. Assuming that a received word containing only Ip information series 2 is input to buffer memory 25 via bus 30, identification signal 28 indicates the fact. At this time, decoding control circuit 29 sends control signals 31, 32 and 33 based on identification signal 28 to control C1 decoding section 26, C3 decoding section 27 and buffer memory 25.

In response to control signal 31, C1 decoding section 26 C1-decodes the received word having a code length of $n_1$ digits (laterally in FIG. 3) to $k_1$-digit data. Such decoding is executed $n_2$ times to provide resultant Ip information series 2 of $(k_1 \times n_2)$ digits which is in turn stored in buffer memory 25.

Control signal 32 prevents C3 decoding section 27 from executing a decoding operation. With control signal 33, the decoded data of Ip information series 2 of $(k_1 \times n_2)$ digits in size is output from buffer memory 25 to bus 30.

Next, assuming that a received word containing both Ip information series 2 and Is information series 5 is input to buffer memory 25, identification signal 28 indicates the fact. Then, decoding control circuit 29 sends control signals 31, 32 and 33 based on identification signal 28 to control C1 decoding section 27, C3 decoding section 27 and buffer memory 25.

In response to control signal 31, C1 decoding section 26 C1-decodes the received work of C1 codes each having a code length of $(n_1-r)$ digits for each $k_1$-digit data (laterally in FIG. 3) $n_2$ times to provide resultant decoded data of $(k_1 \times n_2)$ digits which is in turn stored in buffer memory 25.

At this time, an elimination flag is set in the eliminated portion (encircled by a dashed line in FIG. 3) of C1 check symbols 4 having a size of $(r \times n_2)$ digits which corresponds to the deleted C3 codes, so as to execute elimination correction. Any correcting operation on the eliminated portion is not required.

In response to control signal 32, C3 decoding section 27 C3-decodes the received word containing Is information series 5 having a code length of $n_2$ digits for each $k_3$-digit data (longitudinally in FIG. 3) r times to data or $(r \times k_3)$ digits which is in turn stored in buffer memory 25.

Control signal 33 causes the decoded data of Ip information series 2 of $(k_1 \times n_2)$ digits and the decoded data of Is information series 5 of $(r \times n_2)$ digits to be output from buffer memory 25 to bus 30.

In the case of the code structure shown in FIG. 3, a received word containing Ip information series 2 is C1-decoded only in the first direction. The code structure shown in FIG. 4, on the other hand, requires C2-decoding in the second direction in addition to the C1-decoding in the first direction, resulting in a code structure resistive to a burst error if data is transmitted in the first direction. In this case, C1 decoding section 26 shown in FIG. 6 also has a C3 decoding function for decoding a received work containing Ip information series 2 in the second direction.

In the above embodiment, single buffer memory 25 communicates with C1 decoding section 26 and C3 decoding section 27. Buffer memories may be provided, however, for C1 decoding section 26 and C3 decoding section 27, respectively, thereby speeding up decoding operation.

Figure 7:
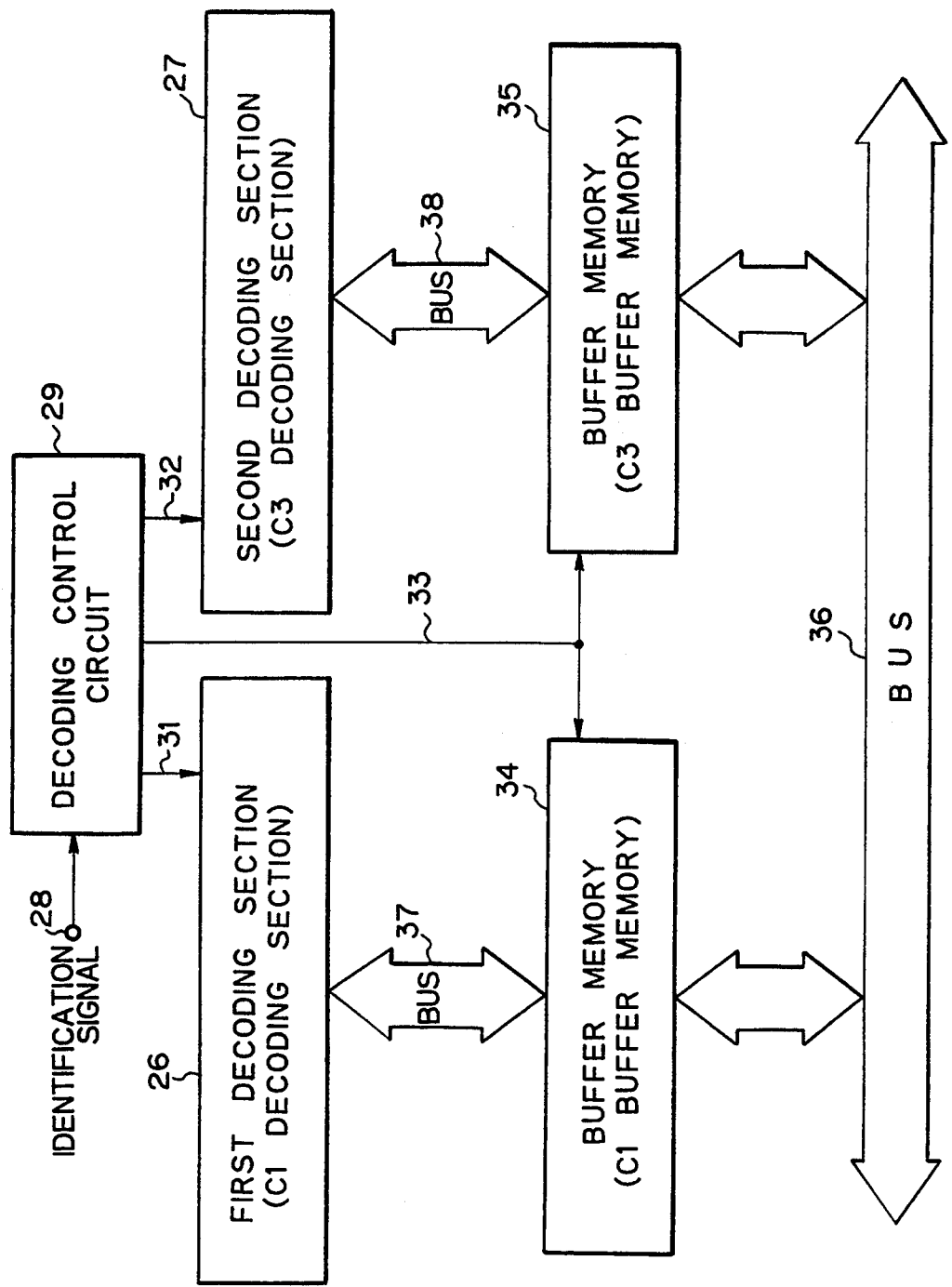
FIG. 7 is a block diagram showing the configuration of another embodiment of a decoder according to the present invention.

FIG. 7 is a block diagram showing the configuration of an embodiment in which buffer memories are provided for C1 decoding section 26 and C3 decoding section 27. Components identical to those shown in FIG. 6 are designated by the same numerals, and the description thereof will be omitted here.

In FIG. 7, the reference numeral 34 denotes a first buffer memory (a C1 buffer memory) to which C1 decoding section 26 gets access exclusively; 35 a second buffer memory (a C3 buffer memory) to which C3 decoding section 27 gets access exclusively; 36 a bus interconnecting buffer memories 34 and 35 and external equipment; 37 a bus interconnecting C1 buffer memory 34 and C1 decoding section 26; and 38 a bus interconnecting C3 buffer memory and C3 decoding section 27.

The operation will next be described. Assuming that a received word containing only Ip information series 2 is input to C1 buffer memory 34, identification signal 28 indicates the fact. Decoding control circuit 29 then sends control signals 31, 32 and 33 based on identification signal 28 to control C1 decoding section 26, C3 decoding section 27, C1 buffer memory 34 and C3 buffer memory 35.

In response to control signal 31, C1 decoding section 26 C1-decodes the received work having a code length of $n_1$ digits (laterally in FIG. 3) to $k_1$-digit data. Such decoding is executed $n_2$ times, and resultant Ip information series 2 of $(k_1 \times n_2)$ digits is stored in C1 buffer memory 34 via bus 37.

Control signal 32 prevents C3 decoding section 26 from executing a decoding operation. Control signal 33 causes the decoded data of Ip information series 2 of $(k_1 \times n_2)$ digits to be output from C1 buffer memory to bus 36 and no data to be output from C3 buffer memory 35.

Next, assuming that a received word containing Ip information series 2 is input to C1 buffer memory 34 and that a received word containing Is information series 5 is input to C3 buffer memory 35, identification signal 28 indicates the fact. Decoding control circuit 29 then sends control signals 31, 32 and 33 based on identification signal 28 to control C1 decoding section 27, C3 decoding section 27, C1 buffer memory 34 and C3 buffer memory 35.

In response to control signal 31, C1 decoding section 26 C1-decodes the received word of C1 codes each having a code length of $(n_1-r)$ digits for each $k_1$-digit data (laterally in FIG. 3) $n_2$ times. Thus, the received word is decoded to decoded data of $(k_1 \times n_2)$ digits which is in turn stored in C1 buffer memory 34.

At this time, an elimination flag is set in the eliminated portion of C1 check symbols 4 which corresponds to the deleted C3 codes and has a size of $(r \times n_2)$ digits, so as to execute elimination correction. Any correcting operation on the eliminated portion is not required.

In response to control signal 32, parallel with C1 decoding section 26, C3 decoding section 27 C3-decodes the received word containing Is information series 5 having a code length of $n_2$ digits (longitudinally in FIG. 3) for each $k_3$-digit data r times to data of $(r \times k_3)$ digits which is in turn stored in C3 buffer memory via bus 38.

Control signal 33 causes the decoded data of Ip information series 2 of $(k_1 \times n_2)$ digits to be output from C1 buffer memory 34 to the bus 36, and the decoded data of Is information series 5 of $(r \times k_3)$ digits to be output from C3 buffer memory 35 to bus 36.

The encoder of the above embodiment encodes only Is information series 5 in the second direction. Similar to the encoding of Ip information series 2, C3 encoding section 13 may produce a product code by encoding information of Is information series 5 having $k_4$ digits in the first direction to data of an r-digit code length which contains check symbols each having a length of $(r-k_4)$ digits and by encoding information having $k_3$ digits in the second direction to data of an $n_2$-digit code length which contains check symbols each having a length of $(n_2-k_3)$ digits.

In decoding such a product code, C3 decoding section decodes information of Is information series 5 having $k_2$ digits in the first direction to data containing check symbols of $(r \times k_4)$ digits as well as executes the decoding of information of $k_3$ digits long in the second direction as a received word of the product code encoded to data having the check symbols of $(n_2-k_3)$ digits.

In the encoder and the decoder described above, the identification signal is used to identify two different states. If an identification signal can be selected in the range of $0 \leq r \leq (n_1-k_1)$, an optimal code structure can be realized depending on an information amount of an Is information series.

In this case, C3 encoding section 13 varies the number "r" according to an identification signal to perform encoding operation. Encoding control circuit 15 varies "r" to control the output of coded data. C3 decoding section 27 varies "r" according to the identification signal to perform decoding operation. Decoding control circuit 29 varies "r" to control C1 and C3 decoding sections 26 and 27.

As described above, according to the present invention, (1) when an identification signal indicates that information contains only an Ip information series, coded data encoded by a first encoding section is output from a buffer memory. (2) When an identification signal indicates that information contains both an Ip information series and an Is information series, a first encoding section encodes the Ip information series and a second encoding section encodes the Is information series, and check symbols of $(r \times n_2)$ digits are deleted from the data encoded by the first encoding section and are not output from the buffer memory and, instead, data of $(r \times n_2)$ digits encoded by the second encoding section is output. As a result, even if information to be encoded increases in amount, an operation for superimposing C3 codes is eliminated, and thus an encoder which encodes data of variable information amount within a block and allows efficient error-correction encoding in a block can be realized without a substantial change in circuit configuration.

According to the present invention, when an Ip information series and an Is information series are encoded using the above encoder, in an encoding operation performed by a first encoding section in the first direction, check symbols each having a length of r digits deleted during transmission are not stored in the buffer memory, thereby providing an encoding method which enables a reduction in encoding period of time.

According to the present invention, (1) when an identification signal indicates that a received word contains only an Ip information series, only a first decoding section performs the decoding, and (2) when an identification signal indicates that a received word contains both an Ip information series and an Is information series, the first decoding section decodes the Ip information series and a second decoding section decodes the Is information series. This obviates an operation for superimposition-separating C3 codes during decoding a received word. Consequently, a decoder which decodes data of a variable information amount within a block and allows efficiently decoding of error-corrected codes within a block can be realized without a substantial change in circuit configuration.

According to the present invention, when a received word containing an Ip information series and an Is information series is decoded using the above decoder, the first decoding section executes the decoding in the first direction considering the check symbols each having a length of r digits which have been deleted at the time of transmission as eliminated digits and does not correct the elimination digit portion, resulting in a decoding method which enables a reduction in decoding period of time.

What is claimed is:

1. An error-correction code encoder, comprising:
   a first encoding section for encoding an Ip information series of $(k_1 \times n_2)$ digits having $k_1$ digits in the first direction and $n_2$ digits in the second direction to coded data containing check symbols each having a length of $(n_1-k_1)$ digits in the first direction;
   a second encoding section for encoding an Is information series of $(r \times k_3)$ digits (where $r \leq n_1-k_1$ and $k_3 < n_2$) to data containing check symbols each having a length of $(n_2-k_3)$ digits in the second direction;
   a buffer memory for storing the data and check symbols of both information series; and
   an encoding control means for controlling said first and second encoding sections and said buffer memory to cause, when an Ip information series is input to said buffer memory, coded data encoded by said first encoding section to be output from said buffer memory, and, when both Ip information series and Is information series are input to said buffer memory, said first encoding section to encode the Ip information series, said second encoding section to encode the Is information series and said buffer memory to delete the check symbols of $(r \times n_2)$ digits of the coded data encoded by said first encoding section and to output the remaining digits of the coded data encoded by said first encoding section and the data of $(r \times n_2)$ digits of the coded data encoded by said second encoding section.

2. An error-correction code encoding method, comprising the steps of:
   encoding an Ip information series of $(k_1 \times n_2)$ digits having $k_1$ digits in the first direction and $n_2$ digits in the second direction to coded data containing check symbols each having a length of $(n_1-k_1)$ digits in the first direction;
   encoding an Is information series of $(r \times k_3)$ digits where $r \leq n_1-k_1$ and $k_3 < n_2$) to data containing check symbols each having a length of $(n_2-k_3)$ digits in the second direction;
   storing the data and check symbols of both information series; and
   causing, when an identification signal indicates that an Ip information series is input to said buffer memory, the coded data encoded by said first encoding section to be output from said buffer memory, and, when an identification signal indicates that both Ip information series and Is information series are input to said buffer memory, said first encoding section to encode the Ip information series, and the second encoding section to encode the Is information series and said buffer memory to output data including the coded data encoded by said first encoding section and the data of $(r \times n_2)$ digits of the coded data encoded by said second encoding section, check symbols of $(r \times n_2)$ digits of the coded data encoded by said first encoder being not stored in said buffer memory when the Ip information series and the Is information series are encoded.

3. A decoder for decoding the data encoded by the encoder according to claim 1, comprising:

a buffer memory for storing a received word of $(n_1 \times n_2)$ digits sent from said encoder;

a first decoding section for decoding said received word for each $k_1$-digit information data $n_2$ times to provide an Ip information series of $(k_1 \times n_2)$ digits;

a second decoding section for decoding said received word for each $k_3$-digit information data r times to provide an Is information series of $(r \times k_3)$ digits;

a decoding control means for controlling said buffer memory and first and second decoding sections to cause, when said received word input to said buffer memory is an Ip information series, said first decoding section to decode the Ip information series, and, when said received word input to said buffer memory contains both Ip information series and Is information series, said first decoding section to decode the Ip information series and said second decoding section to decode the Is information series.

4. A method for decoding the data encoded by the encoder according to claim 1, comprising the steps of:

(1) storing a received word of $(n_1 \times n_2)$ digits sent from said encoder;

(2) decoding said received work for each $k_1$-digit information data $n_2$ time to provide an Ip information series of $(k_1 \times n_2)$ digits;

(3) decoding said received word for each $k_3$-digit information data r times to provide an Is information series of $(r \times k_3)$ digits;

causing, when said received word input to said buffer memory is an Ip information series, said step (2) to be carried out, and, when said received word input to said buffer memory contains both Ip information series and Is information series, said steps (2) and (3) to be carried out, the r-digit data deleted in transmission being treated as eliminated digits whereby the eliminated portion is not corrected when the coded data of $(k_1 \times n_2)$ digits in said received word is decoded in the first direction.

5. An error-correction code encoder, comprising:

a first encoding section for encoding an Ip information series to first coded data including first check symbols;

a second encoding section for encoding an Is information series to second coded data including second check symbols, wherein said second coded data includes fewer digits than said first check symbols; and a buffer memory for storing said first and second coded data, such that a portion of said first check symbols is deleted and replaced by said second coded data.

6. The error-correction code encoder according to claim 5, further comprising encoding control means for controlling said first and second encoding sections and said buffer memory, such that when an Is information series is not input to said buffer memory, said portion of said first check symbols are not deleted.

7. The error-correction code encoder according to claim 6, wherein said encoding control means includes receiver means for receiving an identification signal which indicates when Is information is not input to said buffer memory.

8. An error-correction code encoding method, comprising the steps of:

encoding an Ip information series to first coded data including first check symbols;

encoding an Is information series to second coded data including second check symbols, wherein said second coded data includes fewer digits than said first check symbols;

deleting a portion of said first check symbols; and replacing said deleted portion of said first check symbols with said second coded data.

9. The error-correction code encoding according to claim 8, further comprising the step of storing said first and second coded data in a buffer memory.

10. The error-correction code encoding method according to claim 9, further comprising the step of inhibiting said deleting and replacing steps when no Is information series is coded and no second coded data is input to said buffer memory.

11. The error-correction code encoding method according to claim 10, further comprising the step of receiving an identification signal which indicates when no Is information series is coded and no second coded data is input to said buffer memory.

12. A decoder for decoding encoded data including first data encoding an Ip information series and second data encoding an Is information series, a portion of check symbols of said first data being deleted and replaced by said second data in said encoded data when an Is information series is encoded, said decoder comprising:

a first decoding section for decoding a portion of said encoded data corresponding to said first data to provide an Ip information series; and a second decoding section for decoding a portion of said encoded data corresponding to said second data to provide an Is information series.

13. A decoder according to claim 12, further comprising:

a decoder control means for controlling said first decoding section and said second decoding section such that when said encoded data includes said second data, said first decoding section treats said deleted portion of check symbols as eliminated digits and does not correct said deleted portion, and, when said encoded data does not include said second data, said first decoding section decodes all of said encoded data and said second decoding section does not decode said encoded data.

14. The decoder according to claim 13, wherein said decoder control means includes receiver means for receiving an identification signal which indicates whether said encoded data includes said second data.

15. A method for decoding encoded data including first data encoding an Ip information series and second data encoding an Is information series, a portion of check symbols of said first data being deleted and replaced by said second data in said encoded data when an Is information series is encoded, said method comprising the steps of:

decoding a portion of said encoded data corresponding to said first data to provide an Ip information series;

decoding a portion of said encoded data corresponding to said second data to provide an Is information series.

16. The method according to claim 15, wherein said first decoding step includes treating said deleted portion of check symbols as eliminated digits and not correcting said deleted portion, when said Is information series is encoded.

17. The decoder according to claim 15, wherein said decoding control means includes receiver means for receiving an identification signal which indicates whether said encoded data includes said second data.

* * * * *